United States Patent [19]

Mannerstråle et al.

[11] Patent Number: 5,734,307
[45] Date of Patent: Mar. 31, 1998

[54] DISTRIBUTED DEVICE FOR DIFFERENTIAL CIRCUIT

[75] Inventors: Jacob Filip Mannerstråle, Färlöv, Sweden; Rodney Allen Dolman, Cary, N.C.; Jeffrey Scott Kemp, Broomfield, Colo.

[73] Assignee: Ericsson Inc., Research Triangle Park, N.C.

[21] Appl. No.: 628,029

[22] Filed: Apr. 4, 1996

[51] Int. Cl.⁶ .................................................. H01P 7/08
[52] U.S. Cl. .................................... 333/219; 333/235
[58] Field of Search .............................. 333/203, 204, 333/205, 219, 174, 175, 202, 235

[56] References Cited

U.S. PATENT DOCUMENTS

| | | | |
|---|---|---|---|
| 2,819,452 | 1/1958 | Arditi et al. | 333/205 |
| 3,947,934 | 4/1976 | Olson | 29/25.42 |
| 4,035,695 | 7/1977 | Knutson et al. | 361/400 |
| 4,157,517 | 6/1979 | Kneisel et al. | 333/205 |
| 4,288,530 | 9/1981 | Bedard et al. | 333/205 |
| 4,313,097 | 1/1982 | De Ronde | 333/204 |
| 4,418,324 | 11/1983 | Higgins | 333/204 |
| 4,800,348 | 1/1989 | Rosar et al. | 333/202 |
| 4,905,358 | 3/1990 | Einbinder | 29/25.42 |
| 4,963,843 | 10/1990 | Peckham | 333/203 |
| 5,014,024 | 5/1991 | Shimizu et al. | 333/203 |
| 5,015,976 | 5/1991 | Saka | 333/204 |
| 5,017,897 | 5/1991 | Ooi et al. | 333/204 |
| 5,021,757 | 6/1991 | Kobayashi et al. | 333/205 |
| 5,160,906 | 11/1992 | Siomkos et al. | 333/204 |
| 5,248,949 | 9/1993 | Eguchi et al. | 333/204 |
| 5,291,162 | 3/1994 | Ito et al. | 333/205 |
| 5,294,751 | 3/1994 | Kamada | 174/52.4 |
| 5,541,559 | 7/1996 | Takahashi et al. | 333/204 |

FOREIGN PATENT DOCUMENTS

| | | | |
|---|---|---|---|
| 56-23002 | 4/1981 | Japan . | |
| 60-19302 | 1/1985 | Japan | 333/204 |
| 5-183306 | 7/1993 | Japan | 333/204 |

*Primary Examiner*—Robert Pascal
*Assistant Examiner*—Seungsook Ham
*Attorney, Agent, or Firm*—Jenkens & Gilchrist; Robert H. Kelly

[57] ABSTRACT

An inductive element having a selectable inductive value is connectable to a differential circuit. The inductive element is formed of transmission lines, and the inductive value of the inductive element is altered by trimming away portions of the transmission line while maintaining the inductive element in balance with the differential circuit.

14 Claims, 4 Drawing Sheets

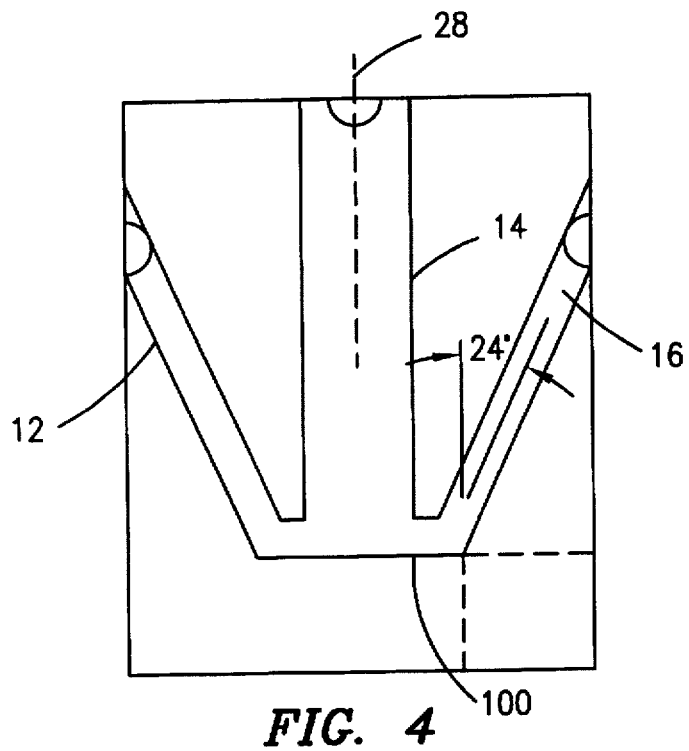
FIG. 4
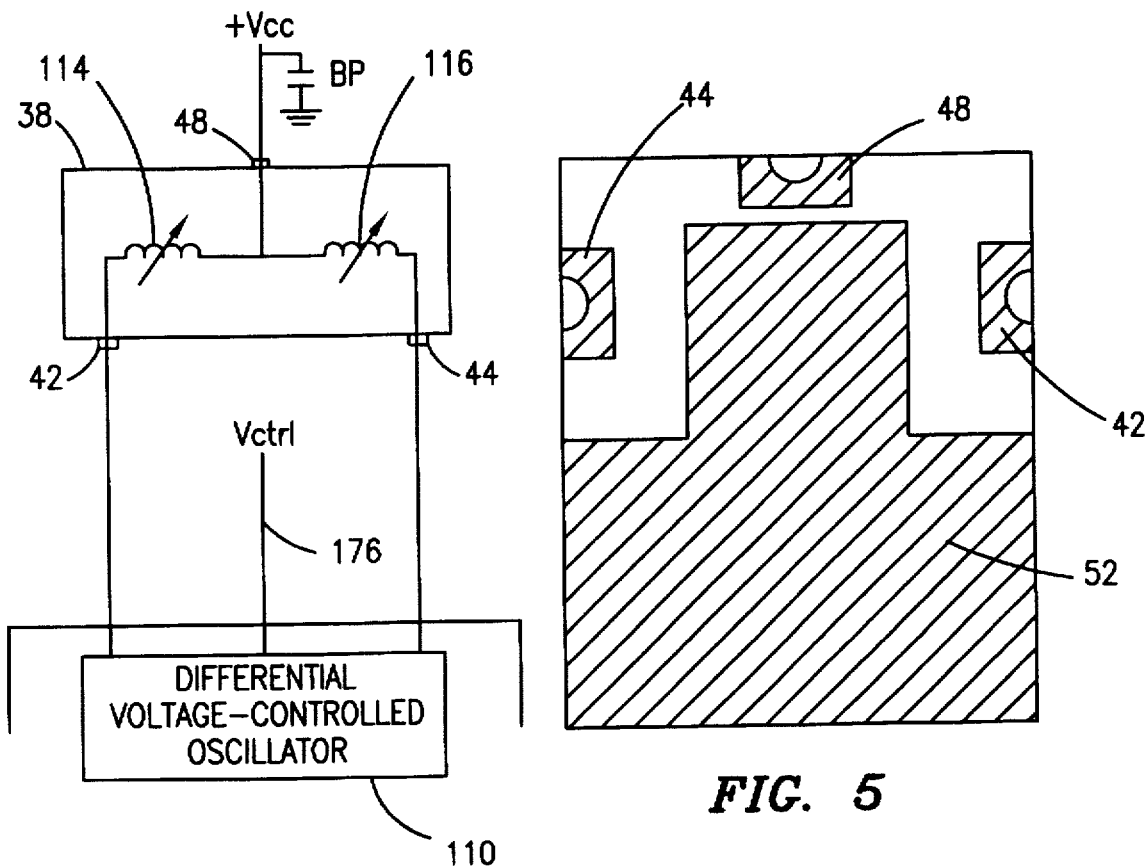
FIG. 6
FIG. 5

DISTRIBUTED DEVICE FOR DIFFERENTIAL CIRCUIT

The present invention relates generally to a distributed, circuit device, such as a distributed, inductive element or a resonator including an inductive element. More particularly, the present invention relates to a distributed, inductive element, or resonator including the inductive element, for a differential circuit. The inductive element is of selectable characteristics and, when coupled to a differential circuit, the characteristics can be altered while maintaining the element in differential balance with the differential circuit.

When the distributed, inductive element is embodied to form a portion of a differential resonator, the resonant frequency of the resonator can be tuned by altering the characteristics of the inductive element. When connected to a differential circuit, such as a differential voltage-controlled oscillator, the resonator can be tuned while maintaining the resonator in balance with the differential circuit. The characteristics of the inductive element are altered, thereby to tune the resonator, merely by trimming away portions of the inductive element, but in a manner which maintains the inductive element and the resonator in balance with the differential circuit. Because the characteristics of the inductive element can be altered by trimming away, such as by a laser trimming process, portions of the inductive element while maintaining the inductive element in balance with the differential circuit, alteration of the characteristics of the inductive element, and tuning of the differential resonator, can occur during circuit assembly of any electronic device including such elements.

BACKGROUND OF THE INVENTION

Advancements in electronic technologies have permitted the development and usage of electronic devices operable at high frequencies, e.g., frequencies approaching, and in excess of, one gigahertz. Radio communication devices are exemplary of electronic devices which are operable at such frequencies. The circuit elements operable at such frequencies must sometimes be significantly different in configuration than corresponding circuit elements of electronic devices operable at lower frequencies.

For instance, conventional lumped elements, i.e., discrete elements, can sometimes not be used to form portions of an electronic device operable at high frequencies. At high frequencies, parasitic inductances and capacitances sometimes become significant, affecting the performance and operability of the electronic device incorporating discrete circuit elements.

Instead, distributed circuit elements formed of transmission lines, such as microstrips or striplines, are used to form the circuit elements. Inductive, capacitive, and resistive elements can all be formed of transmission lines, appropriately formed and appropriately configured.

As mentioned previously, radio communication devices operable in certain types of radio communication systems are sometimes constructed to be operable at high frequencies. Radio transmitters of a high-frequency radio communication system are available which transmit electromagnetic signals of such frequencies. Similarly, such a high-frequency, radio communication system also includes radio receivers for receiving high-frequency, electromagnetic signals.

To generate such electromagnetic signals, the circuitry of the radio transmitter must be able to up-convert an information signal in frequency to form the electromagnetic signal. For instance, the radio transmitter includes mixer circuitry for mixing the information signal with a modulating signal. Sometimes, the mixer circuitry is comprised of multiple stages of mixing elements.

Analogously, a radio receiver operable to receive a high-frequency, electromagnetic signal includes circuitry to down-convert a received, high-frequency signal. A radio receiver also includes mixing circuitry, operable in a radio receiver to down-convert the received signal. Again, the mixer circuitry is sometimes formed of multiple stages including multiple stages of mixing elements.

The modulating signals applied to the mixer circuitry of the radio transmitter and radio receiver are typically formed by oscillator circuitry. The oscillator circuitry generates oscillating signals; the oscillating signals are used to form the mixing signals applied to the mixers. The oscillating signals generated by the oscillator circuitry must be of precise frequencies to ensure proper operation of the radio transmitter or radio receiver.

The oscillator circuitry typically is coupled to, or includes, resonant circuitry. The resonant circuitry oftentimes includes inductive elements. As fixed-value, inductive elements of high precision typically cannot be affordable constructed, the inductive elements typically include a variable inductor having a selectable inductive value. The ability to alter the inductive value of the variable inductor permits alteration of the resonant frequency of the resonant circuit. That is to say, by altering the inductive value of the inductive element, the resonant element can be tuned to overcome manufacturing variances.

Some oscillator circuitry, particularly when operable at high frequencies, generates differential signals. Oscillator circuitry which generate differential signals are referred to as differential oscillators, and the differential signals generated by the differential oscillators are differentially offset in phase relative to one another.

Resonant circuitry for a differential circuit must, however, be maintained in balance with the differential circuit. The inductive element of the resonant circuitry must, therefore, be maintained in balance with the differential circuit.

Other circuitry similarly is sometimes constructed to be differential in nature, either to receive differential input signals or to generate differential output signals. Such other circuitry sometimes also requires the use of an inductor, or a differential resonator formed of, or including, such an inductor, maintained in balance with the differential circuit.

As mentioned previously, circuits operable at high frequencies typically utilize distributed circuit elements, such as distributed, inductive elements. The inductive value of a distributed, inductive element can be altered by "trimming" the element. In a trimming procedure, a portion of the transmission line is removed, or trimmed.

When a conventional, distributed, inductive element is coupled to a differential circuit, alteration of the characteristics of the inductive element by a trimming process becomes problematical.

Trimming of the inductor is accomplished with only significant difficulty as the inductor must remain in balance as the inductor is trimmed. For instance, when a differential resonator including such an inductor is coupled to a differential oscillator, the differential resonator is coupled at two locations to the differential oscillator. The inductive element of such a resonator must be maintained in balance to permit the differential oscillator to be properly operable and to be properly tunable.

As existing inductors can be trimmed and maintained in balance only with significant difficulty, such trimming of existing inductors cannot easily be performed in a high-volume process, such as during electronic device assembly in an assembly line-like process. An inductor, such as that which can be utilized to form a portion of a differential resonator, and a method for altering the characteristics of such an element, more quickly and easily, would therefore be advantageous.

It is in light of this background information related to distributed, circuit elements used together with differential circuits that the significant improvements of the present invention have evolved.

SUMMARY OF THE INVENTION

The present invention advantageously provides a distributed device, such as an inductive element, which is connectable to a differential circuit. The inductive value of the inductive element is altered by trimming away portions of a transmission line which forms a portion of the inductive element. The transmission line can be trimmed while maintaining the inductive element in balance with the differential circuit to which the element is coupled.

When the inductive element is embodied to form a portion of a differential resonator, the resonant frequency of the resonator can be tuned by altering the characteristics of the inductive element. When connected to a differential circuit, such as a differential voltage-controlled oscillator, the resonator can be tuned while maintaining the resonator in balance with the differential circuit. The characteristics of the inductive element are altered, thereby to tune the resonator, merely by trimming away portions of the inductive element but in a manner which maintains the inductive element and the resonator in balance with the differential circuit. Because the characteristics of the inductive element can be altered by trimming away portions of the inductive element while maintaining the element in balance with the differential circuit, alteration of the characteristics of the inductive element can be effectuated during circuit assembly of an electronic device including such an element.

In these and other aspects, therefore, an inductive element is of a selectable inductive value. A pair of transmission lines is formed upon a substrate having a top face surface. The pair of transmission lines includes a first transmission line and a second transmission line. The first and second transmission lines each define an inner side portion and an outer side portion. An intermediate transmission line is formed upon the substrate and extends between the first and second transmission lines. The intermediate transmission line includes a center tuning portion. The pair of transmission lines and the intermediate transmission line together define the inductive element. The inductive value of the inductive element is selectable by trimming away parts of the center tuning portion of the intermediate transmission line.

A more complete appreciation of the present invention and the scope thereof can be obtained from the accompanying drawings which are briefly summarized below, the following detailed description of the presently-preferred embodiments of the invention, and the appended claims.

BRIEF DESCRIPTION OF THE DRAWINGS

FIG. 4 illustrates a plan view, similar to that shown in FIG. 2, but of an inductive element of another embodiment of the present invention.

FIG. 5 illustrates a plan view taken from beneath the inductive element of the embodiment shown in FIG. 4.

FIG. 6 illustrates a schematic diagram of the inductive element shown in any of the preceding figures connected to form a portion of a resonant circuit coupled to a differential, oscillator circuit.

DETAILED DESCRIPTION

Figure 1:
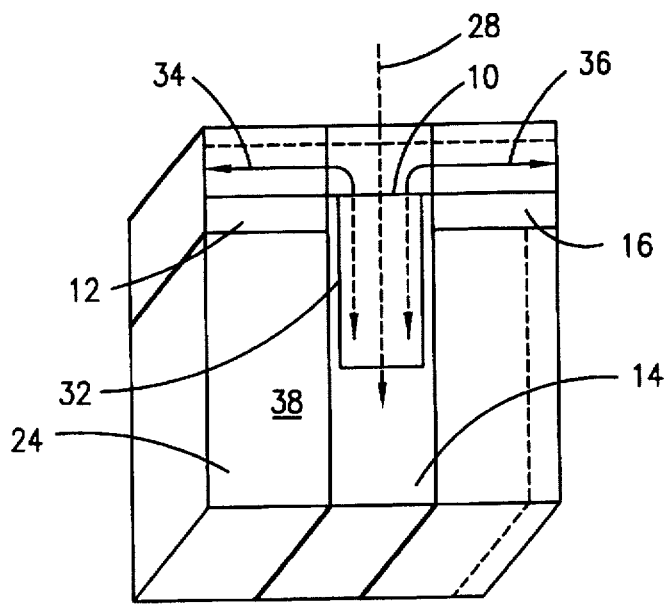
FIG. 1 illustrates a perspective view of an inductive element of an embodiment of the present invention.

Referring first to FIG. 1, an inductive element, shown generally at 10, of an embodiment of the present invention is illustrated. The inductive element 10 forms a distributed, circuit element, operable to function as an inductor when high frequency signals are applied thereto. The inductive element is formed of three transmission lines, transmission lines 12, 14, and 16. The transmission lines 12–16 are printed upon a substrate 22, in conventional fashion.

The transmission lines 12 and 16 are positioned inline with one another to extend horizontally across the top face surface 24 of the substrate 22. The transmission lines 12 and 16 extend about side surfaces of the substrate 22 and onto a bottom face surface (hidden from view in the figure) of the substrate to form terminal pads thereat.

The transmission line 14 is formed to extend vertically along the top face surface 24 of the substrate 22. The inner side portions of all three of the transmission lines 12, 14 and 16 merge together, and the characteristics of the transmission lines 12–16 together define the inductive value of the inductive element formed of the transmission lines.

In the embodiment illustrated in the figure, the outer side portion of the transmission line 14 extends about a side face surface of the substrate 22 and onto a bottom face surface (hidden from view in the figure) to form a terminal pad thereat.

The transmission line 14 extends vertically along the top face surface 24 of the substrate 22, symmetrical about an axial line 28. The transmission line 14 is further centered between the transmission lines 12 and 16, and the transmission lines 12 and 16 are similarly balanced about the axial line.

The inner side portion of the transmission line 14 includes a center tuning portion 32. The center tuning portion 32 is also symmetrical about the axial line 28.

The inductive value of the inductive element 10 formed of the three transmission lines is altered by trimming away portions of the center tuning portion 32. The trimming of the center tuning portion is effectuated, for example, by a laser trimming process, in conventional fashion. As portions of the center tuning portion 32 are trimmed away, the lengths of the transmission lines 12 and 16 are increased, as indicated by the lines 34 and 36, and the length of the transmission line 14 is reduced. Correspondingly, the characteristic impedances of the transmission lines 12 and 16 the impedance of the transmission line 14 are also altered.

By trimming away increased amounts of the center tuning portion 32, the inductive value of the inductive element 10 is increased. Because both the center tuning portion 32 and the inductive element 10 of which the portion 32 forms a portion are symmetrical about the axial line 28, the symmetrical sides of the inductive element 10 remain balanced as portions of the center tuning portion 32 are trimmed away.

The inductive element 10 is thereby advantageously utilized with a differential circuit by coupling the terminal paths formed at the outer side portions of the transmission lines 12 and 16 to the differential circuit. The symmetrical sides of the inductive element 10 are maintained in balance with the differential circuit even as the center tuning portion 32 is trimmed to alter the inductive value of the inductive element. In one embodiment, the inductive element 10 forms a tunable inductor of a resonator circuit and the inductor element 10, when suitably coupled to receive an excitation force, defines a resonator module 38.

Figure 2:
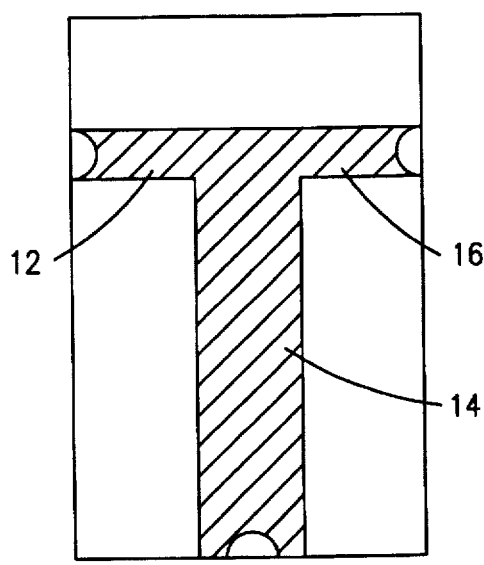
FIG. 2 illustrates a plan view, taken from above the inductive element shown in FIG. 1.

FIG. 2 again illustrates the inductive element, again shown to be formed of transmission lines 12, 14, and 16, each having inner side portions which merge together together to form the inductive element 10 having an inductive value defined by the characteristics of the transmission lines. The inductive value of the inductive element 10 is altered by trimming away portions of the center tuning portion 32 while maintaining the portions of the inductive element, symmetrical about the axial line 28, in balance thereabout.

Figure 3:
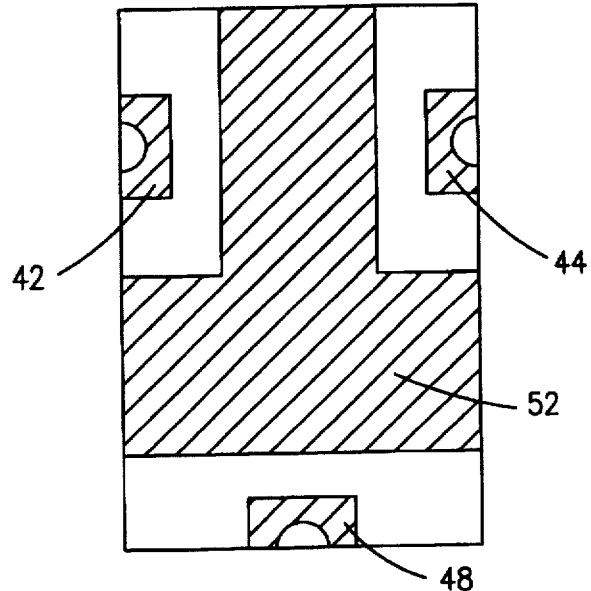
FIG. 3 illustrates a plan view, similar to that shown in FIG. 2, but taken from beneath the inductive element.

FIG. 3 again illustrates the inductive element 10 and the resonator module 38 of which the inductive element 10 forms a portion. In the view of FIG. 3, the terminal pads, here terminal pads 42 and 44, formed at the outer side portions of the transmission lines 12 and 16, respectively, upon the bottom face surface 46 of the substrate 22 are shown. The terminal pad, here terminal pad 48, formed at the outer side portion of the transmission line 14 is also illustrated.

The terminal pads 42 and 44 form connection terminals permitting connection of the transmission lines 12 and 16 to, for example, connect the inductive element to a differential circuit. The terminal pad 48 forms a connection terminal to connect the inductive element 10 to, for example, a bias source. A painted portion 52 is also formed upon the bottom face surface 46, electrically isolated from the terminal pads 42, 44, and 48. The painted portion 52 is connectable, for example, to a ground plane, thereby also to capacitively couple the terminal pads to an electrical ground plane.

FIG. 4 illustrates an inductive element, here shown generally at 100, of another embodiment of the present invention. Portions of the inductive element 100 which corresponds to portions of the inductive element 10 shown previously in FIG. 1, shall be like-numbered.

The inductive element 100 is also shown to be formed of transmission lines 12, 14, and 16 formed upon a substrate 22. The shapes of the transmission lines 12–16 of the inductive element 100 differ with the corresponding transmission lines of the inductive element shown previously in FIGS. 1–3. Here, while inner side portions of the three transmission lines again merge together, the inductive element is W-shaped in appearance while the inductive element 10 is T-shaped in appearance.

The inductive element 100 is also symmetrical about an axial line 28 and again includes a center tuning portion 32. By trimming away portions of the center tuning portion 32, the inductive value of the inductive element 100 is altered while maintaining symmetry of the portions of the inductive element 100 about the axial line.

Terminal pads 42 and 44 formed at outer side portions of the transmission lines 12 and 16, respectively, upon the bottom face surface 46 of the substrate 22 are shown in FIG. 5. FIG. 5 further illustrates the terminal pad 48 formed at an outer side portion of the transmission line 14 upon the bottom face surface 46. A painted portion 52, segregated from the terminal pads 42, 44, and 48, is also painted upon the bottom face surface 46 of the substrate 22. The terminal pads 42, 44, and 48 are connectable in manners described previously with respect to the description of FIGS. 1–3 above as is also the painted portion 52.

The inductive elements 10 and 100 shown in FIGS. 1–3 and FIGS. 4–5, respectively, illustrate but two of many different configurations of which an inductive element symmetrical about an axial line can form. Selection of the particular shape and size of the inductive element, as desired, permits an inductive element of desired characteristics to be formed. By trimming away a center tuning portion, the inductive value of the inductive element can be selected with precision.

FIG. 6 illustrates the resonator module coupled to a differential circuit 110, here a voltage-controlled oscillator. The inductive element 10 is here represented by balanced, tunable inductors 114 and 116. Terminal pads 42 and 44 of the inductive element connect the resonator module 38 to the electrical circuit 110. And, the terminal pad 48 connects the resonator 38 to a bias source and capacitively couples the module to a ground plane. The resonator module 38 here forms a portion of a resonator circuit. While not separately shown, additional portions of the resonator circuit are positioned together with the electrical circuit 110. By altering the inductive value of the inductive element 10, the resonator circuit is tuned to be resonant at a selected resonant frequency.

The voltage-controlled oscillator forming the differential circuit 110 illustrated in the Figure is exemplary in nature; the differential circuit can, of course, instead be formed of another type of differential circuit. A voltage control signal is also applied to the circuit 110, here by way of a transmission line 176. The lines extending along the circuit board upon which the differential circuit 110 is disposed which connect the module 38 with the circuit 110 are here also formed of transmission lines. Once suitably connected together, the resonator module forms a portion of the differential circuit.

As described previously, the inductive value of the inductive element 10 can be altered while maintaining the balance of the inductive element with a differential circuit to which the inductive element 10 is coupled. Here, the inductive value of the inductive element 10 is altered to tune the resonator circuit of which the resonator module 38 forms a portion, thereby to cause the resonator circuit to resonate at a selected resonant frequency, here to control the frequency of oscillation of the differential, voltage-controlled oscillator forming the differential circuit 110. Portions of the center tuning portion 32 of the inductive element 10 are trimmed away, in conventional fashion, such as by a laser trimming process, which can be performed quickly and while detecting the effects of the trimming process on differential signals generated by the differential circuit 110.

Figure 7:
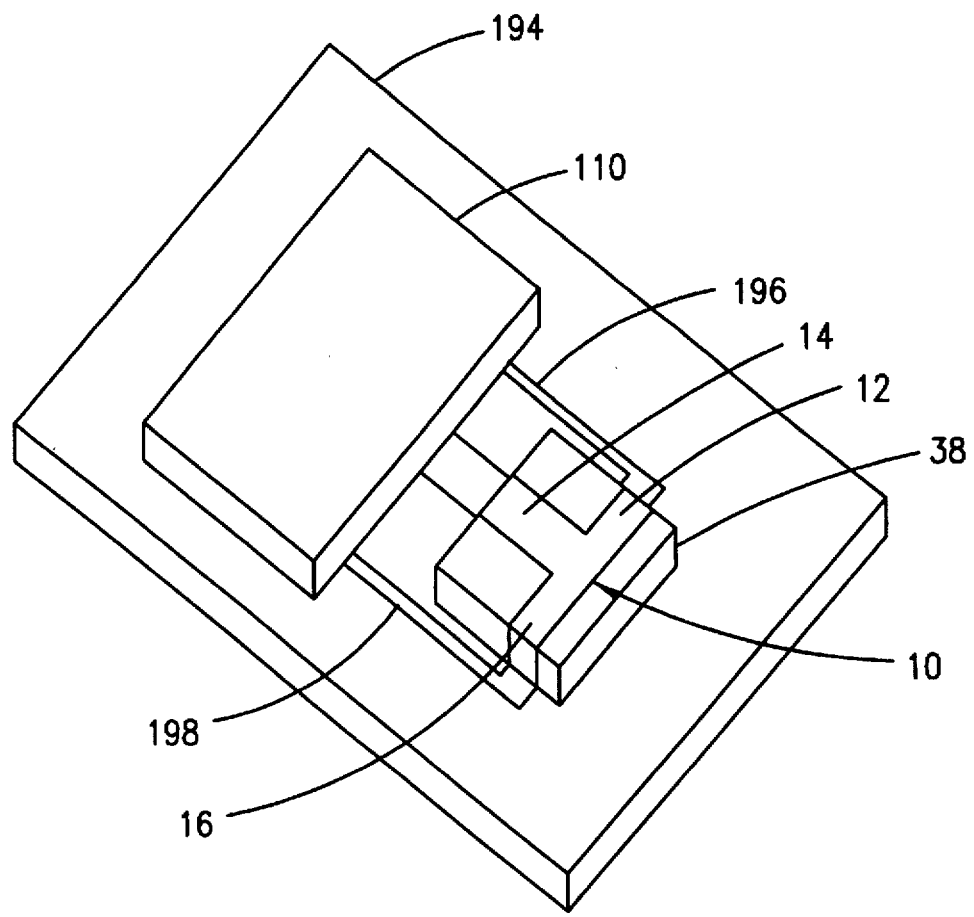
FIG. 7 illustrates a perspective view of the circuit shown schematically in FIG. 6.

FIG. 7 illustrates the differential circuit 110 mounted upon a printed circuit board 194. Circuit paths 196 and 198 are here formed upon the circuit board 194 to permit connection of the circuit 110 with the terminal pads 42 and 44 of the resonator module 38 when the resonator module 38 is suitably positioned upon the printed circuit board 194. When the module 38 is suitably positioned upon the circuit board 194, the inductive element 10 and connected thereto, such as by a reflow solder process, trimming of the center tuning portion 32 is commenced. By trimming the center tuning portion 32, the inductive value of the inductive element 10 is altered, as desired.

Assembly of an electronic device, such as a radiotelephone, including the circuitry shown in FIG. 7 can be performed in an assembly line-like process, such as in a pick-and-place process. Alteration of the characteristics of the inductive element, or of the resonant frequency of a resonator including such an inductive element can be performed quickly, during the assembly process, all while maintaining the inductive element in balance with the differential circuit 110.

Figure 8:
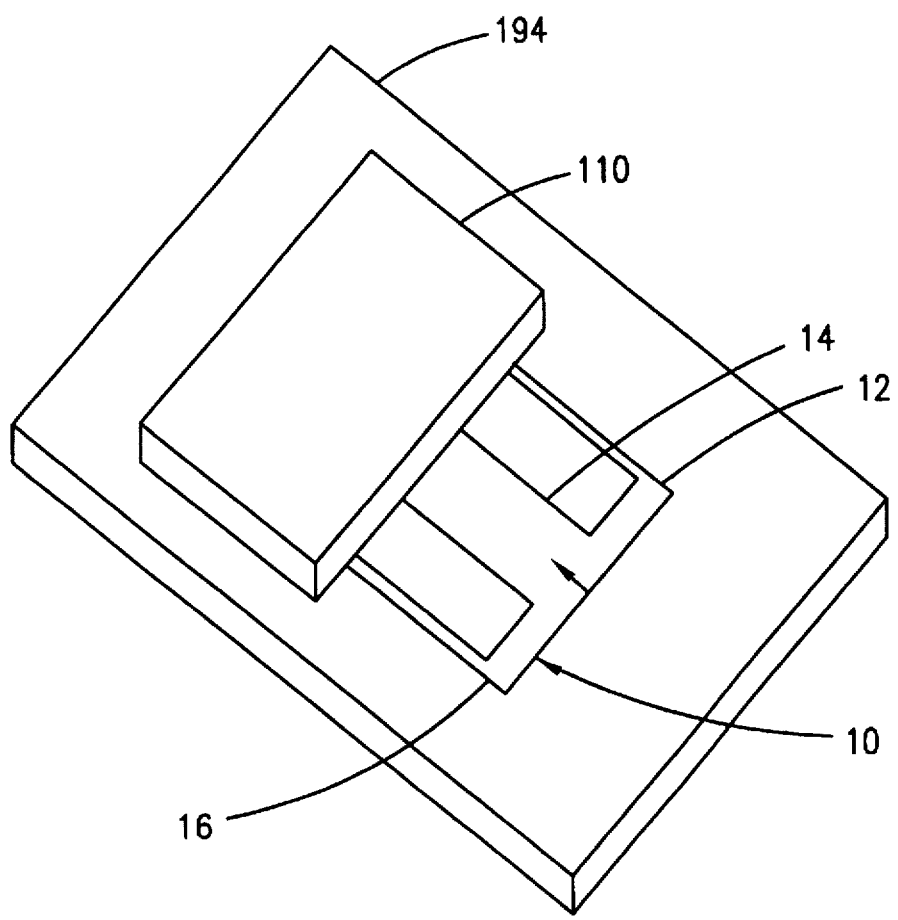
FIG. 8 illustrates a perspective view of the circuit shown schematically in FIG. 6, similar to that shown in FIG. 7, but which includes an inductive element of another embodiment of the present invention.

FIG. 8 again illustrates the differential circuit 110 mounted upon the printed circuit board 194. In this embodiment, the printed circuit board 194 forms the substrate upon which the transmission lines 12, 14, and 16 are formed. Alteration of the inductive value of the inductive element formed of the transmission lines is, however, again similarly effectuated by trimming away portions of the center tuning portion 32.

As described with respect to the preceding figures, the inductive value of the inductive element can be altered, all the while by maintaining the inductive element in balance with a differential circuit. When the distributed, inductive element is embodied to form a portion of a differential resonator, the resonant frequency of the resonator can be tuned by altering the characteristics of the inductive element. When connected to a differential circuit, the resonator can be tuned while maintaining the resonator in balance with the differential circuit. The characteristics of the inductive element are altered, thereby to tune the resonator, merely by trimming away portions of the inductive element. However, the inductive element is maintained in balance with the differential circuit. Because the characteristics of the inductive element can be altered by trimming away portions of the inductive element while maintaining the element in balance with the differential circuit, alteration of the characteristics of the inductive element can be effectuated during circuit assembly of an electronic device including such elements.

The previous descriptions are of preferred examples for implementing the invention, and the scope of the invention should not necessarily be limited by this description. The scope of the present invention is defined by the following claims.

What is claimed is:

1. In a differential circuit operable at a selected frequency, an improvement of a distributed tunable inductive element tunable during operation of the differential circuit to tune the differential circuit to the selected frequency, said tunable inductive element comprising:

a substrate having a top face surface;

a pair of transmission lines formed upon the top face surface of said substrate, said pair including a first transmission line and a second transmission line, the first and second transmission lines, respectively, each defining an inner side portion and an outer side portion, said pair of transmission lines symmetrical about a longitudinally-extending axis defined along the substrate; and an intermediate transmission line formed upon said substrate and extending between the first and second transmission lines, said intermediate transmission line symmetrical about the longitudinally-extending axis, said intermediate transmission line including a center tuning portion, said center tuning portion further symmetrical about the longitudinally-extending axis, said tuning portion trimmable while maintained in symmetry about the longitudinally-extending axis to tune the differential circuit to the selected frequency.

2. The tunable inductive element of claim 1 wherein the differential circuit comprises a differential resonant circuit, wherein the selected frequency comprises a selected resonant frequency and wherein said center tuning portion is trimmed to tune the differential resonant circuit to the selected resonant frequency.

3. The tunable inductive element of claim 1 wherein said substrate comprises a printed circuit board.

4. The tunable inductive element of claim 3 wherein at least portions of the differential circuit are mounted upon said printed circuit board.

5. The tunable inductive element of claim 1 wherein at least portions of the differential circuit are mounted upon a printed circuit board and wherein said substrate is mountable upon the printed circuit board.

6. The tunable inductive element of claim 5 wherein said substrate further comprises a bottom face surface, the bottom face surface mountable upon the printed circuit board, and wherein the parts of the center tuning portion are trimmed away to select the selected frequency of the differential circuit subsequent to mounting of said substrate upon the printed circuit board.

7. The tunable inductive element of claim 1 wherein the differential circuit comprises a differential voltage-controlled oscillator circuit, and wherein selection of which of the parts of the center tuning portion are trimmed away further select operational characteristics of the voltage-controlled oscillator circuit.

8. The tunable inductive element of claim 1 wherein the parts of the center tuning portion of said intermediate line are trimmed away by a laser trimming device.

9. The tunable inductive element of claim 1 wherein said intermediate transmission line further defines an inner side portion and an outer side portion, the inner side portion of said intermediate transmission line extending between the first and second transmission lines of said pair and the center tuning portion formed to include the inner side portion of said intermediate transmission line.

10. The tunable inductive element of claim 9 wherein said intermediate transmission line is capacitively coupled to an electrical ground plane.

11. The tunable inductive element of claim 9 wherein said intermediate transmission line further defines a power-connection terminal formed at the outer side portion thereof, said power-connection terminal connectable to receive a bias voltage.

12. In a method for operating a differential circuit at a selected frequency, an improvement of a method for forming a distributed tunable inductive element tunable during operation of the differential circuit to tune the differential circuit to the selected frequency, said method comprising the steps of:

forming a first transmission line upon a face surface of a substrate, the first transmission line defining an inner side portion and an outer side portion;

forming a second transmission line upon the substrate, the second transmission line also defining an inner side portion and an outer side portion, the first transmission line and the second transmission line symmetrical about a longitudinally-extending axis defined along the substrate;

forming an intermediate transmission line upon the substrate, the intermediate transmission line formed to extend between the first and second transmission lines, the intermediate transmission line symmetrical about the longitudinally-extending axis; and trimming away selected portions of the intermediate transmission line while maintaining the intermediate transmission line in symmetry about the longitudinally-extending axis to tune the differential circuit to the selected frequency.

13. The method of claim 12 comprising the further step of biasing the the distributed tunable inductive element.

14. The method of claim 12 wherein said step of trimming comprises trimming material symmetrically positioned about the longitudinally-extending axis.

* * * * *

UNITED STATES PATENT AND TRADEMARK OFFICE
CERTIFICATE OF CORRECTION

PATENT NO. : 5,734,307
DATED : March 31, 1998
INVENTOR(S) : Jacob Filip Mannerstrale, Rodney Allen Dolman and Jeffrey Scott Kemp It is certified that error appears in the above-identified patent and that said Letters Patent is hereby corrected as shown below:

<u>Title page,</u>
Item [56], References Cited, U. S. PATENT DOCUMENTS, insert
-- 3,939,429    02/1976        Lohn et al.    325/432 -- ; and
insert -- * -- after each of the following:
"2,819,452", "4,288,530", "4,313,097", "5,015,976", "5,017,897", "5,021,757", "5,248,949", "5,291,162"; and "5,541,559".

FOREIGN PATENT DOCUMENTS, insert
-- GB   1470695        04/1977      Great Britain
   DT   2460762B1      04/1976      Germany --; and
insert -- * -- after each of the following:
"60-19302" and "5-183306".

Signed and Sealed this

Fifteenth Day of November, 2005

JON W. DUDAS
*Director of the United States Patent and Trademark Office*